(12) United States Patent
Matsuura et al.

(10) Patent No.: US 7,898,174 B2
(45) Date of Patent: Mar. 1, 2011

(54) ORGANIC ELECTROLUMINESCENT DISPLAY DEVICE WITH MOISTURE RESISTANT STRUCTURAL BODY INCLUDING ADHESIVE LAYER

(75) Inventors: Toshiyuki Matsuura, Mobara (JP); Masahiro Tanaka, Chiba (JP)

(73) Assignee: Hitachi Displays, Ltd., Chiba (JP)

( * ) Notice: Subject to any disclaimer, the term of this patent is extended or adjusted under 35 U.S.C. 154(b) by 527 days.

(21) Appl. No.: 11/676,615

(22) Filed: Feb. 20, 2007

(65) Prior Publication Data

US 2007/0194711 A1    Aug. 23, 2007

(30) Foreign Application Priority Data

Feb. 20, 2006    (JP) .............................. 2006-042275

(51) Int. Cl.
  *H05B 33/04* (2006.01)
  *H01J 1/62* (2006.01)
(52) U.S. Cl. ...................... 313/512; 313/504; 313/506; 428/690
(58) Field of Classification Search .................. 313/512
  See application file for complete search history.

(56) References Cited

U.S. PATENT DOCUMENTS

| | | | |
|---|---|---|---|
| 5,189,405 A * | 2/1993 | Yamashita et al. ........... | 313/512 |
| 6,195,142 B1 * | 2/2001 | Gyotoku et al. ............... | 349/69 |
| 6,891,330 B2 * | 5/2005 | Duggal et al. ................ | 313/511 |
| 6,992,439 B2 * | 1/2006 | Yamazaki et al. ........... | 313/512 |
| 7,345,420 B2 | 3/2008 | Kubota | |
| 7,728,326 B2 * | 6/2010 | Yamazaki et al. ............. | 257/40 |
| 2004/0177577 A1 * | 9/2004 | Voegele et al. ................. | 52/306 |
| 2004/0232833 A1 * | 11/2004 | Menda et al. ................ | 313/512 |
| 2006/0066236 A1 * | 3/2006 | Tanaka et al. ................ | 313/512 |
| 2006/0170341 A1 * | 8/2006 | Su et al. ...................... | 313/512 |

FOREIGN PATENT DOCUMENTS

| | | |
|---|---|---|
| JP | 2000-348859 | 12/2000 |
| JP | 2001-307872 | 11/2001 |
| JP | 2001-357973 | 12/2001 |
| KR | 10-2004-0098030 | 11/2004 |

* cited by examiner

*Primary Examiner*—Sikha Roy
(74) *Attorney, Agent, or Firm*—Antonelli, Terry, Stout & Kraus, LLP.

(57) ABSTRACT

An organic EL display device includes a moisture-resistant structural body which covers an upper surface and a side surface of an organic light emitting layer which is formed on a main surface of an insulation substrate and is formed by stacking a first moisture prevention layer, a moisture absorption layer, a second moisture prevention layer, and an adhesive layer which covers the upper and side surface of the organic EL layer. The first moisture prevention layer, the moisture absorption layer and the second moisture prevention layer on the side surface of the organic light emitting layer include portions are bent toward the side surface from the upper surface of the organic light emitting layer and, further, are bent parallel to a main surface of the insulation substrate from the side surface, and lower surfaces of the respective bent portions of at least one of the layers are hermetically adhered to the main surface of the substrate by the adhesive layer.

8 Claims, 4 Drawing Sheets

ORGANIC ELECTROLUMINESCENT DISPLAY DEVICE WITH MOISTURE RESISTANT STRUCTURAL BODY INCLUDING ADHESIVE LAYER

CROSS-REFERENCE TO RELATED APPLICATIONS

The disclosure of Japanese Patent Application No. 2006-042275 filed on Feb. 20, 2006 (yyyy/mm/dd) including the claims, the specification, the drawings and the abstract is incorporated herein by reference in its entirety.

BACKGROUND

1. Field of the Invention

The present invention relates to an organic EL display device, and more particularly to a technique which is effectively applicable to an organic EL display device which can prolong a lifetime thereof and can enhance reliability thereof by suppressing the degradation of an organic EL layer attributed to moisture.

2. Description of the Related Art

As a flat-panel-type display device, a liquid crystal display device (LCD), a plasma display device (PDL), a field emission type display device (FED), an organic EL display device (OLED) and the like have been put into practice or have been studied for future practical use. Among these display devices, the organic EL display device which is a typical example of a thin and light-weighted self-luminous display device is an extremely prospecting display device as a future display device.

The organic EL display device is classified into a so-called bottom-emission-type organic EL display device and a top-emission-type organic EL display device. In the bottom-emission-type organic EL display device, an organic EL element is constituted of a light emitting mechanism which is formed by sequentially stacking a transparent electrode (ITO or the like) which constitutes a first electrode or one electrode, a multi-layered organic film which emits light by applying an electric field thereto (also referred to as a organic light emitting layer), and a metal electrode having reflective property which constitutes a second electrode or another electrode on an insulation substrate which is preferably formed of a glass substrate. A large number of organic EL elements are arranged in a matrix array and another substrate or a sealing film which is referred to as a sealing can and covers the stacked structure is provided to interrupt the above-mentioned light emitting structure from an external atmosphere. Then, for example, by using a transparent electrode as an anode and a metal electrode as a cathode electrode and by applying an electric field between both electrodes, carriers (electrons and holes) are injected into the organic multi-layered film so as to allow the organic multi-layered film to emit light. This emission of light is radiated to the outside from a glass substrate side.

On the other hand, the top-emission-type organic EL display device is configured such that the above-mentioned one electrode is formed of a metal electrode having a reflective property and the above-mentioned another electrode is formed of a transparent electrode made of ITO or the like, an electric field is applied to both electrodes to allow the light emitting layer to emit light, and the light is radiated to another electrode side. In the top-emission-type organic EL display device, a transparent plate which is preferably formed of a glass plate may be used as the sealing can in the bottom-emission-type organic EL display device.

Such an organic EL display device has a drawback that an organic film which constitutes the light emitting layer is easily degraded due to moisture. Conventionally, a desiccant (a drying agent) is arranged in the inside of the sealing can or the sealing film.

FIG. 9 is a general cross-sectional view of an essential part of the organic EL display device having the conventional sealing can structure. The organic EL display device is configured such that an organic light emitting layer OLE is formed on a main surface (inner surface) of a glass substrate SUB which constitutes an insulation substrate, an upper layer of the organic light emitting layer OLE is covered with a sealing can CEL which forms a desiccant DSC on an inner surface thereof by way of a vacuum layer or an inactive gas layer VN from above, and a rib LB which is formed on a periphery of the sealing can CEL is fixedly mounted on the glass substrate SUB by an adhesive layer SEL.

With respect to this type of organic EL display device, patent document 1 discloses an organic EL display device which covers an organic light emitting layer with an insulation layer and an oxygen/moisture reaction layer and covers the organic light emitting layer with a resin layer thus sealing the organic light emitting layer. Patent document 2 discloses the organic EL display device by arranging a predetermined gas removing agent along a sealing material. Further, patent document 3 discloses the organic EL display device which seals an element by sandwiching a high moisture-absorbent film with low moisture-absorbent film.

Patent documents 1: JP-A-2000-348859
Patent documents 2: JP-A-2001-307872
Patent documents 3: JP-A-2001-357973

SUMMARY

In patent document 1, since a moisture prevention layer is not provided between the oxygen/moisture reaction layer and the organic light emitting layer, the organic light emitting layer is degraded due to a gas which is diffused into the oxygen/moisture reaction layer or is separated from the oxygen/moisture reaction layer. When the desiccant is provided only to the outer periphery of the organic light emitting layer in patent document 2, a position at which the desiccant is arranged is limited and hence, it is not possible to incorporate a sufficient quantity of desiccant in the inside of the sealed space. In patent document 3, as described in FIG. 1 of the document, the organic light emitting layer is degraded due to an element degrading gas which is diffused along an interface between a first moisture absorbing layer and a substrate from an end portion of the sealing layer.

Further, when a flexible organic EL display device is realized by using a resilient substrate which constitutes a thin film transistor substrate and a polymer organic light emitting layer or in realizing or when a hard insulation substrate made of glass or the like is used and a resin film member is used for sealing the insulation substrate, the organic light emitting layer is degraded by the intrusion of a gas from a sealed end, the generation of a gas from a desiccant layer, and the re-discharge of the gas which is absorbed once.

Accordingly, it is an object of the present invention to provide an organic EL display device which can maintain a light emission efficiency thereof and can possess a prolonged lifetime thereof by suppressing the degradation attributed to moisture of a multi-layered organic light emitting layer which includes such sealing structure.

The means of the present invention which can achieve the above-mentioned object can be realized by providing a moisture prevention layer of high gas barrier property between an electrode which is arranged on an uppermost layer of an organic light emitting layer and a moisture absorption layer (desiccant) formed on a sealing film side. To describe specific constitutional examples of the present invention, they are as follows.

An organic EL display element of the present invention includes a first electrode which is formed on a main surface of an insulation substrate, an organic EL layer of the multi-layered structure which is formed on the first electrode, a second electrode which is formed on the organic EL layer, and a sealing member which covers the second electrode and has a peripheral end portion thereof sealed to a peripheral portion of the insulation substrate. An organic light emitting layer is constituted of the first electrode, the organic EL layer of the multi-layered structure and the second electrode.

Further, the organic EL display element is characterized by including a moisture-resistant structural body which covers an upper surface and a side surface of the organic EL layer and is formed by stacking a first moisture prevention layer, a moisture absorption layer and a second moisture prevention layer in this order, wherein the first moisture prevention layer, the moisture absorption layer and the second moisture prevention layer on the side surface of the organic EL layer are bent toward the side surface from the upper surface of the organic EL layer and, further, is bent parallel to a main surface of the insulation substrate from the side surface, and lower surfaces of the respective bent portions are hermetically adhered to the main surface of the substrate.

Further, the present invention is characterized in that an adhesive layer is formed between the moisture absorption layer and the second moisture prevention layer, and the first moisture prevention layer and the moisture absorption layer are fixedly mounted on the main surface of the substrate by the adhesive layer together with the second moisture prevention layer.

Further, the present invention is characterized in that the first moisture prevention layer is made of silicon nitride (SiN), the moisture absorption layer is made of calcium (Ca) and the second moisture prevention layer is made of aluminum (Al) foil.

Further, the present invention is characterized in that a first adhesive layer is formed between the organic EL layer and the first moisture prevention layer, and a second adhesive layer is formed between the first moisture prevention layer and the moisture absorption layer, and the first moisture prevention layer is fixedly mounted on the main surface of the substrate by the first adhesive layer and, at the same time, the moisture absorption layer and the second moisture prevention layer are fixedly mounted on the main surface of the substrate by the second adhesive layer.

Further, the present invention is characterized in that the first moisture prevention layer is formed of an aluminum foil, the moisture absorption layer is made of zeolite (a product name), and the second moisture prevention layer is formed of an aluminum foil.

Further, the present invention is characterized in that the sealing member is formed of a laminate film made of polyethylene terephthalate.

Further, the present invention is characterized in that a caulking agent is applied to a periphery of the sealing member and a sealing region of the insulation substrate.

Further, the present invention is characterized in that the caulking agent is a silicon-based waterproof caulking agent.

Due to the respective means of the present invention, there is no possibility that a gas which is separated from a desiccant layer or a gas which is diffused in the desiccant layer after intruding from an end portion of a sealing layer reaches the organic light emitting layer thus suppressing the degradation of the organic light emitting layer. Since the material which exhibits high heat resistance and high chemical resistance can be used for forming the moisture prevention layer, the freedom in the selection of the desiccant can be increased. Further, it is possible to seal using the resin film and hence, it is possible to provide the display device which is light-weighted and thin and which exhibits high reliability and a prolonged lifetime.

DETAILED DESCRIPTION OF THE INVENTION

Hereinafter, the present invention is explained in conjunction with embodiments by reference to drawings showing the embodiment.

Figure 1:
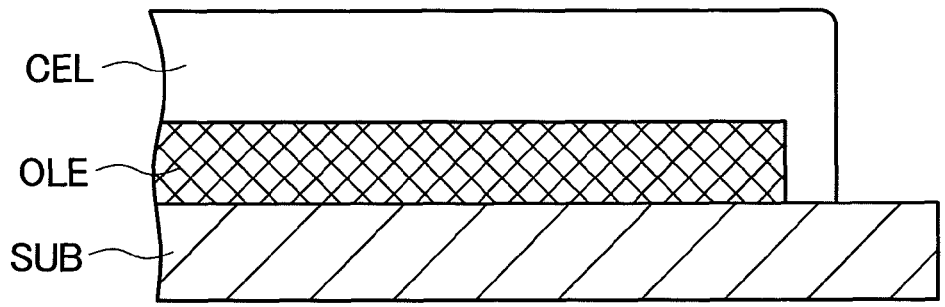
FIG. 1 is a cross-sectional view of an essential part for explaining the schematic structure of an organic EL display element of the present invention.

FIG. 1 is a cross-sectional view of an essential part for explaining the schematic structure of an organic EL display element of the present invention. The organic EL display element includes a light emitting layer OLE having the organic EL multi-layered structure which is stacked on a main surface of a thin film transistor substrate (TFT substrate) SUB, and a sealing film CEL formed of a resin film which completely covers an upper layer and side surfaces of the light emitting layer OLE.

Figure 2:
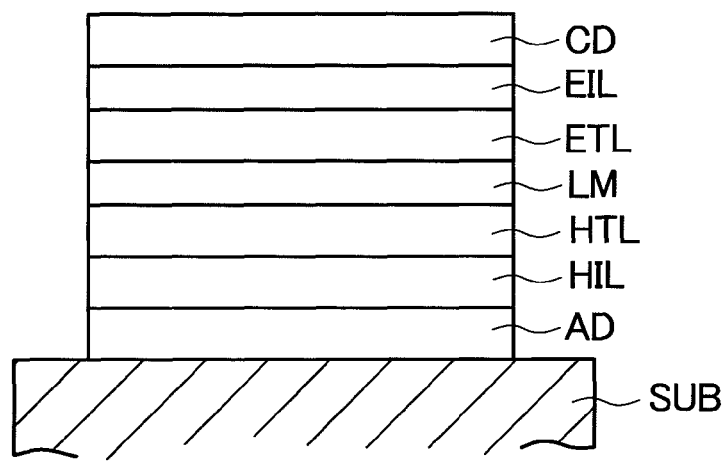
FIG. 2 is a cross-sectional view of an essential part for explaining a structural example of a light emitting layer.

FIG. 2 is a cross-sectional view of an essential part for explaining a structural example of the light emitting layer OLE. Here, the sealing film CEL shown in FIG. 1 is omitted. In FIG. 2, the light emitting layer OLE is formed on one electrode (first electrode) AD which is formed on a main surface of the TFT substrate SUB. First of all, a hole injection layer HIL is formed. A hole transport layer HTL, a light emitting layer LM, an electron transport layer ETL and an electron injection layer EIL are stacked on the hole injection layer HIL, wherein another electrode (second electrode) CD is formed as an uppermost layer. Here, the first electrode AD constitutes an anode and a second electrode CD constitutes a cathode.

Figure 3:
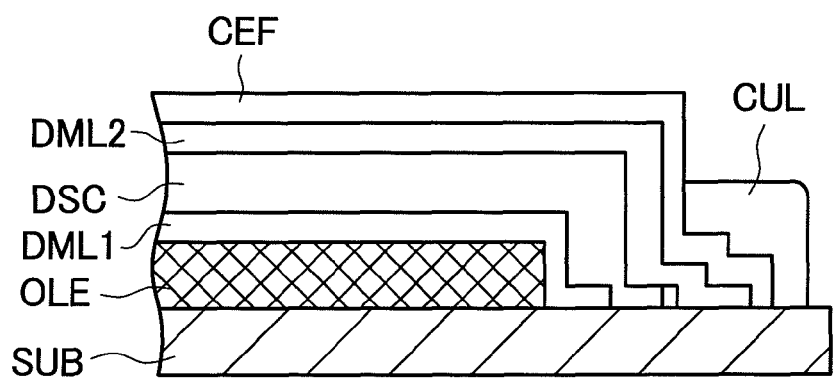
FIG. 3 is a cross-sectional view of an essential part for explaining the basic structure of an organic EL display device according to the present invention.

FIG. 3 is a cross-sectional view of an essential part for explaining the basic structure of an organic EL display device according to the present invention. The organic EL display device includes the above-mentioned light emitting layer OLE on a main surface of the TFT substrate SUB, and a first moisture prevention layer DML1 is formed on the light emitting layer OLE. A moisture absorption layer (desiccant) DSC is formed on the first moisture prevention layer DML1 and, further, a second moisture prevention layer DML2 is formed on the moisture absorption layer DSC, and a sealing film CEF made of a resin film is formed as an uppermost layer. The sealing film CEF has a periphery thereof hermetically adhered to the TFT substrate SUB while also covering side surfaces of the light emitting layer OLE and, thereafter, sealing is performed using a caulking agent CUL. The moisture resistance structural body of the present invention is constituted of the above-mentioned first moisture prevention layer DML1, the moisture absorption layer DSC and the second moisture prevention layer DML2.

Embodiment 1

Figure 4:
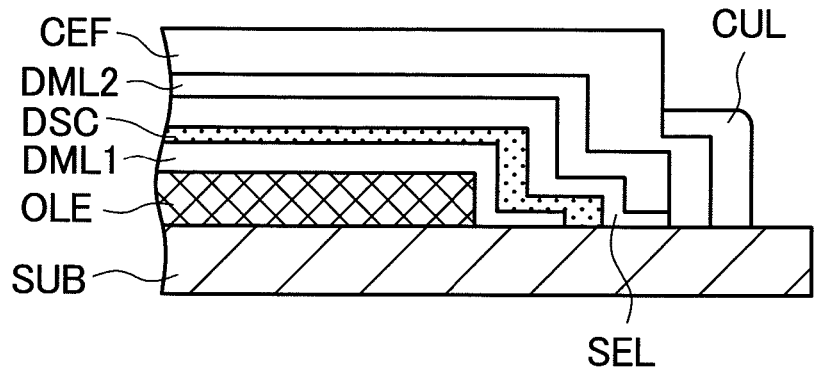
FIG. 4 is a cross-sectional view of an essential part for explaining the structure of an embodiment 1 of the organic EL display device according to the present invention.

FIG. 4 is a cross-sectional view of an essential part for explaining the structure of an embodiment 1 of the organic EL display device according to the present invention. The basic structure of the organic EL display device is substantially equal to the corresponding structure of the organic EL display device shown in FIG. 3. In the embodiment 1, on the light emitting layer OLE, the first moisture prevention layer DML1 and the moisture absorption layer DSC which are stacked on the main surface of the TFT substrate SUB, an adhesive layer SEL is formed. That is, in the embodiment 1, the adhesive layer SEL is formed between the moisture absorption layer DSC and the second moisture prevention layer DML2, wherein the adhesive layer SEL fixedly mounts the first moisture prevention layer DML1 and the moisture absorption layer DSC to the main surface of the TFT substrate SUB together with the second moisture prevention layer DML2.

The first moisture prevention layer DML1 is made of silicon nitride (SiN), the moisture absorption layer DSC is made of calcium (Ca), and the second moisture prevention layer DML2 is formed of an aluminum foil (Al). In this structure, peripheries of respective layers which constitute the moisture resistant structural body are bent in two steps, bent end surfaces extend along the main surface of the TFT substrate SUB, and extended portions are sealed to the TFT substrate SUB by the adhesive layer SEL. Further, a periphery of the sealing film CEF formed of a resin film, preferably a laminate film of polyethylene terephthalate is bent in two steps and extended portions are sealed by the caulking agent CUL. In this structure, an adhesive area between the moisture-resistant structural body and the sealing film CEF and the TFT substrate SUB is increased and hence, it is possible to effectively interrupt the sealed light emitting layer OLE from the external atmosphere including the elongation of an intrusion path of the moisture.

Embodiment 2

Figure 5:
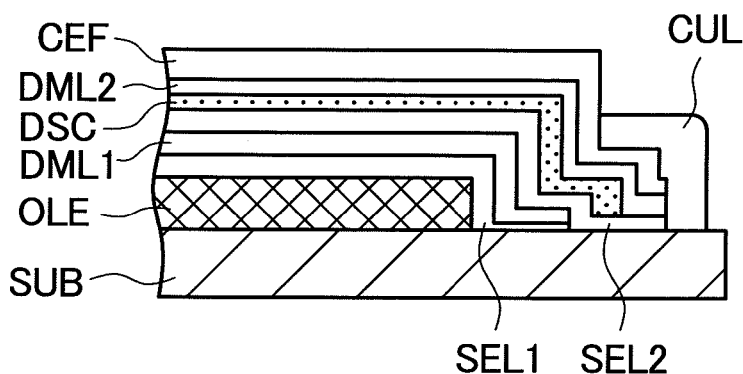
FIG. 5 is a cross-sectional view of an essential part for explaining the structure of an embodiment 2 of the organic EL display device according to the present invention.

FIG. 5 is a cross-sectional view of an essential part for explaining the structure of an embodiment 2 of the organic EL display device according to the present invention. The basic structure of the organic EL display device is substantially equal to the corresponding structure of the organic EL display device shown in FIG. 3. In the embodiment 2, a first adhesive layer SEL1 is arranged between the light emitting layer OLE and the first moisture prevention layer DML1 which are stacked on the main surface of the TFT substrate SUB, and a second adhesive layer SEL2 is arranged between the first moisture prevention layer DML1 and the moisture absorption layer DSC. In the embodiment 2, wherein these adhesive layers SEL1, SEL2 fixedly mount the first moisture prevention layer DML1, the moisture absorption layer DSC and the second moisture prevention layer DML2 to the main surface of the TFT substrate SUB.

The first moisture prevention layer DML1 is formed of an aluminum foil (Al), the moisture absorption layer DSC is made of zeolite (product name), and the second moisture prevention layer DML2 is formed of an aluminum foil (Al). Also in this structure, peripheries of respective layers which constitute the moisture resistant structural body are bent in two steps, bent end surfaces extend along the main surface of the TFT substrate SUB, and extended portions are sealed to the TFT substrate SUB by the adhesive layer SEL. Further, a periphery of the sealing film CEF formed of a resin film, preferably a laminate film of polyethylene terephthalate is bent in two steps and extended portions are sealed by the caulking agent CUL. In this structure, an adhesive area between the moisture-resistant structural body and the sealing film CEF and the TFT substrate SUB is increased and hence, it is possible to effectively interrupt the sealed light emitting layer OLE from the external atmosphere including the elongation of an intrusion path of the moisture.

Figure 6:
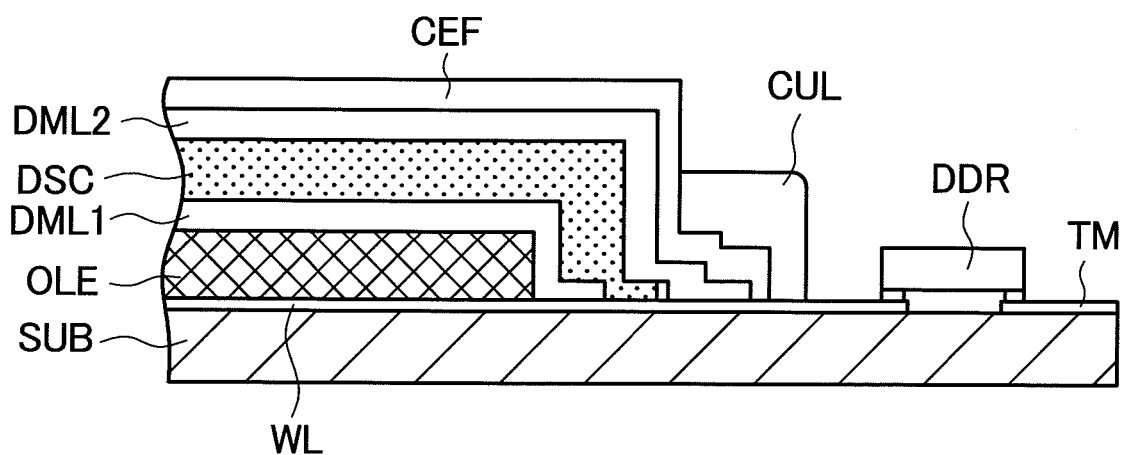
FIG. 6 is a cross-sectional view of an essential part for explaining another constitutional part of the organic EL display device representing the organic EL display device explained in conjunction with the embodiment 1.

FIG. 6 is a cross-sectional view of an essential part for explaining another constitutional part of the organic EL display device representing the organic EL display device explained in conjunction with the embodiment 1. In the organic EL display device, a line WL is formed on a periphery of the main surface of the TFT substrate SUB. The line WL extends to the outside from a sealing film CEF and is connected to a drive circuit chip (DDR). Here, symbol TM indicates a terminal to which a flexible printed circuit board is connected. In the explanation of the above-mentioned respective embodiments, the light emitting layer OLE is formed on the main surface of the TFT substrate SUB. In the actual structure, on the TFT substrate SUB, thin film transistors, lines, an insulation film, electrodes, a protective film which protects these components and the like are formed. Accordingly, the light emitting layers OLE and lines are formed on these components and, further, a moisture resistant structural body and a sealing film CEF are hermetically sealed on these components.

Figure 7:
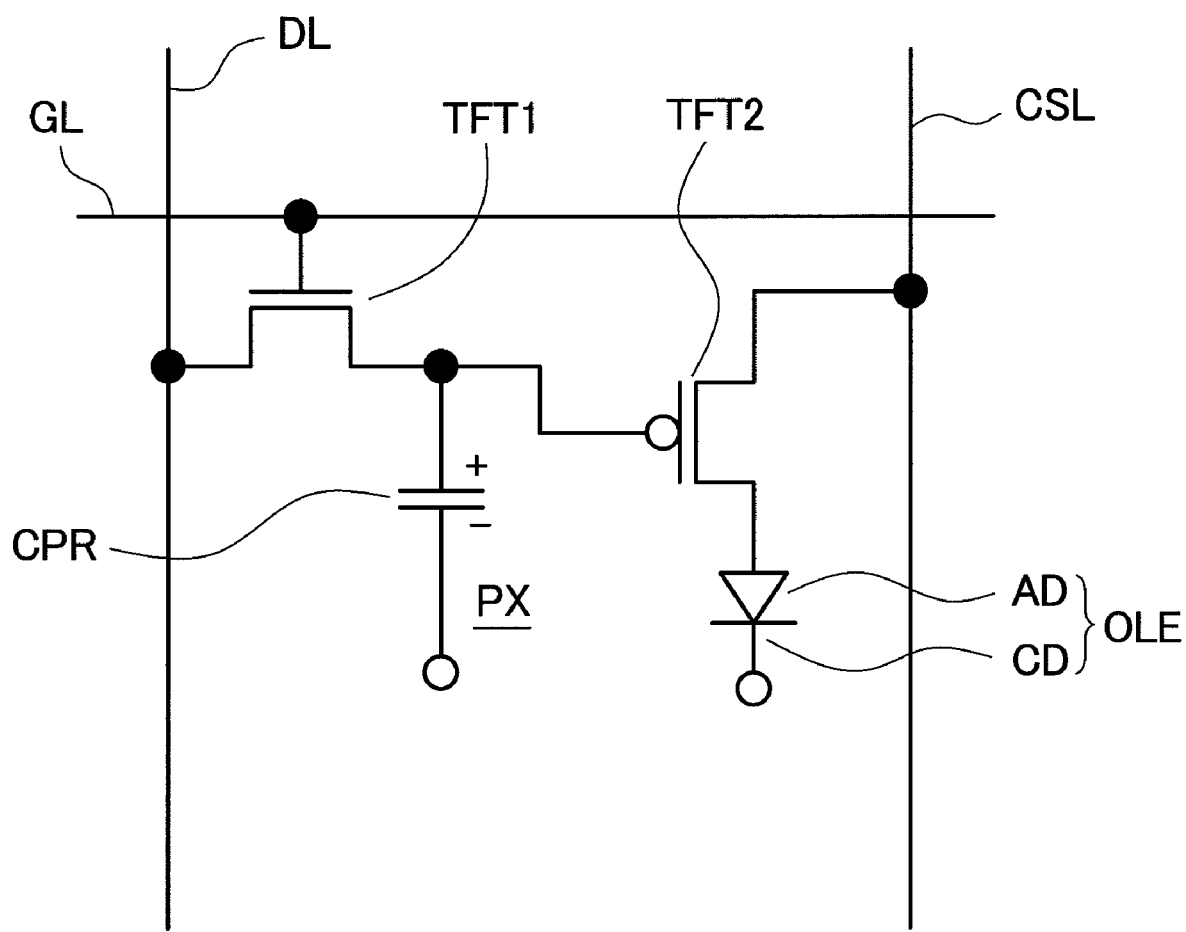
FIG. 7 is an explanatory view of one example of a pixel circuit which constitutes the organic EL element.

FIG. 7 is an explanatory view of one example of a pixel circuit which constitutes the organic EL element. In FIG. 7, pixels PX are formed in intersecting portions of scanning lines GL and data lines DL. In the pixel of this example, a first thin film transistor TFT1, a second thin film transistor TFT2, a capacitance CPR, and an organic EL element OLE are arranged as illustrated in the drawing. The first thin film transistor TFT1 of the pixel which is selected by the scanning line GL stores a charge which corresponds to a magnitude of a display signal supplied from the data line DL in the capacitance CPR. The second thin film transistor TFT2 becomes conductive corresponding to the magnitude of the charge stored in the capacitance CPR and an electric current from a power source line CSL flows into another electrode CD from one electrode AD of the organic EL element OLE. The organic EL element OLE emits light due to this electric current.

Figure 8:
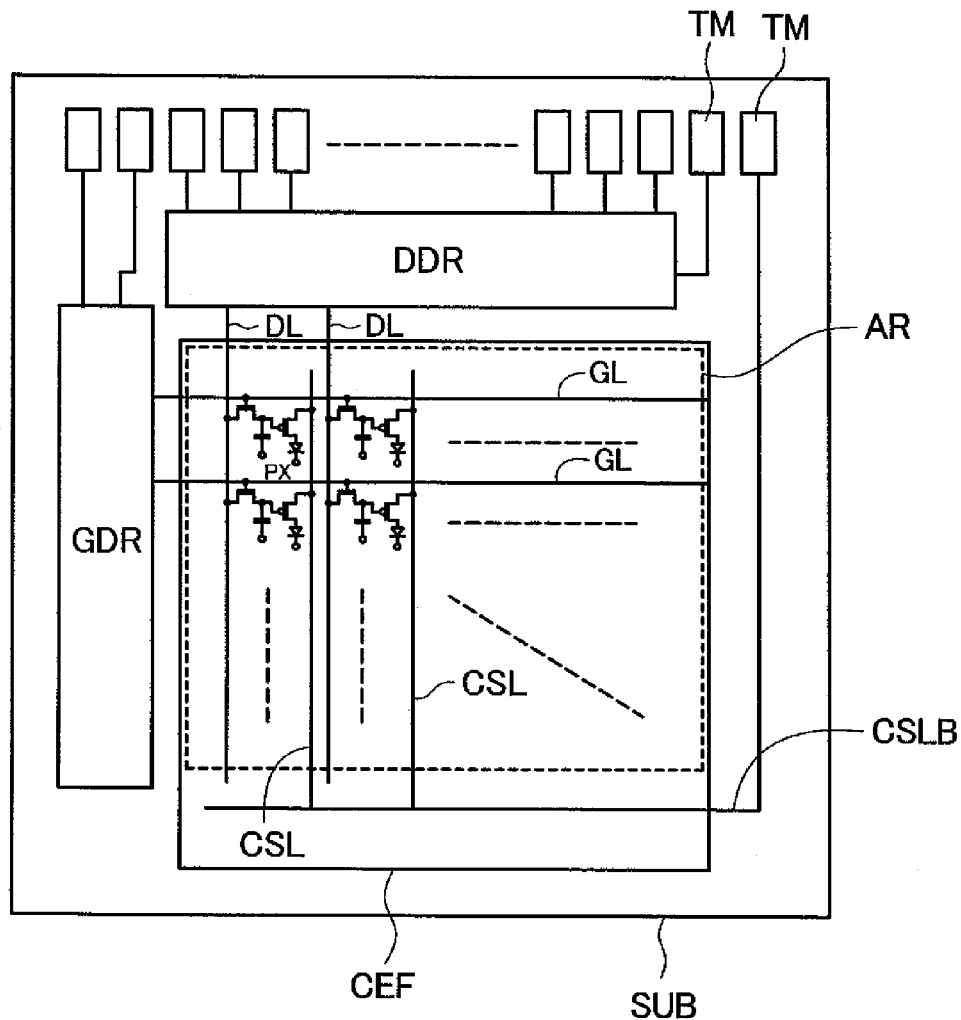
FIG. 8 is an equivalent circuit diagram for explaining an example of the whole constitution of the organic EL display device according to the present invention.
Figure 9:
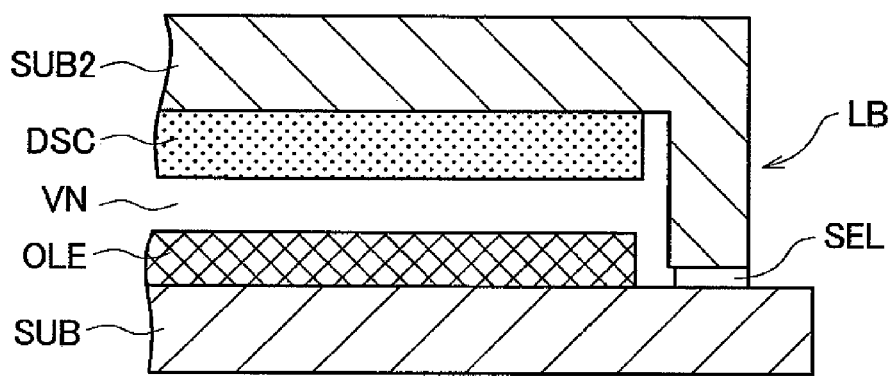
FIG. 9 is a schematic cross-sectional view of an essential part of the organic EL display device having the conventional sealing can structure.

FIG. 8 is an equivalent circuit diagram for explaining an example of the whole constitution of the organic EL display device according to the present invention. The pixels PX which constitute the pixel circuits of the organic EL elements having the constitution explained in conjunction with FIG. 7 are arranged in the display region AR in a matrix array thus constituting a two-dimensional display device. As explained in conjunction with FIG. 7, each pixel PX is constituted of the first thin film transistor TFT1, the second thin film transistor TFT2, a capacitor Cs and the organic EL element OLED. The organic EL element OLED is constituted of one electrode AD, the organic light emitting layer OLE and another electrode CD as shown in FIG. 7.

In the inside of the display region AR, data lines DL and gate lines GL which supply drive signals to the respective pixels are arranged in an intersecting manner. A portion of the insulation substrate SUB is larger than the sealing film CEF and projects from the sealing film CEF. A data line drive circuit chip DDR and a gate line drive circuit chip GDR are mounted on such a projecting portion and these chips supply display signals to the drain lines DL.

The invention claimed is:

1. An organic EL display device comprising:
a first electrode which is formed on a main surface of an insulation substrate;
an organic EL layer of the multi-layered structure which is formed on the first electrode;
a second electrode which is formed on the organic EL layer; and
a sealing member which covers the second electrode and has a peripheral end portion thereof sealed to a peripheral portion of the insulation substrate;
wherein the organic EL display device includes a moisture-resistant structural body which covers an upper surface and a side surface of the organic EL layer and is formed by stacking over the organic EL layer, at least a first moisture prevention layer, a moisture absorption layer and a second moisture prevention layer in this order;
wherein the moisture-resistant structural body includes at least one adhesive layer which covers the upper surface and the side surface of the organic EL layer;
wherein the first moisture prevention layer, the moisture absorption layer and the second moisture prevention layer have portions which are bent toward the side surface from the upper surface of the organic EL layer and, further, are bent parallel to the main surface of the insulation substrate from the side surface, and a lower surface of one of the bent portions of at least one of the first moisture prevention layer, the second moisture prevention layer and the moisture absorption layer is hermetically adhered to the main surface of the insulation substrate by the at least one adhesive layer; and
wherein the at least one adhesive layer is at least formed between the moisture absorption layer and the second moisture prevention layer, and the first moisture prevention layer and the moisture absorption layer are fixedly mounted on the main surface of the substrate by the at least one adhesive layer together with the second moisture prevention layer.

2. An organic EL display device according to claim 1, wherein the first moisture prevention layer is made of silicon nitride, the moisture absorption layer is made of calcium and the second moisture prevention layer is made of aluminum.

3. An organic EL display device according to claim 1, wherein the at least one adhesive layer includes a first adhesive layer formed between the organic EL layer and the first moisture prevention layer, and a second adhesive layer formed between the first moisture prevention layer and the moisture absorption layer, and
wherein the first moisture prevention layer is fixedly mounted on the main surface of the substrate by the first adhesive layer and, at the same time, the moisture absorption layer and the second moisture prevention layer are fixedly mounted on the main surface of the substrate by the second adhesive layer.

4. An organic EL display device according to claim 3, wherein the first moisture prevention layer is formed of an aluminum foil, the moisture absorption layer is made of zeolite (a product name), and the second moisture prevention layer is formed of an aluminum foil.

5. An organic EL display device according to any one of claims 1 to 4, wherein the sealing member is formed of a laminate film made of polyethylene terephthalate.

6. An organic EL display device according to any one of claims 1 to 5, wherein a caulking agent is applied to a periphery of the sealing member and a sealing region of the insulation substrate.

7. An organic EL display device according to claim 6, wherein the caulking agent is a silicon-based waterproof caulking agent.

8. An organic EL display device comprising:
a first electrode which is formed on a main surface of an insulation substrate;
an organic EL layer of the multi-layered structure which is formed on the first electrode;
a second electrode which is formed on the organic EL layer; and
a sealing member which covers the second electrode and has a peripheral end portion thereof sealed to a peripheral portion of the insulation substrate;
wherein the organic EL display device includes a moisture-resistant structural body which covers an upper surface and a side surface of the organic EL layer and is formed by stacking over the organic EL layer, at least a first moisture prevention layer, a moisture absorption layer and a second moisture prevention layer in this order;
wherein the moisture-resistant structural body includes at least one adhesive layer which covers the upper surface and the side surface of the organic EL layer;
wherein the first moisture prevention layer, the moisture absorption layer and the second moisture prevention layer have portions which are bent toward the side surface from the upper surface of the organic EL layer and, further, are bent parallel to the main surface of the insulation substrate from the side surface, and a lower surface of one of the bent portions of at least one of the first moisture prevention layer, the second moisture prevention layer and the moisture absorption layer is hermetically adhered to the main surface of the insulation substrate by the at least one adhesive layer; and
wherein the at least one adhesive layer is at least formed between the moisture absorption layer and the second moisture prevention layer, and the at least one adhesive layer enables the first moisture prevention layer and the moisture absorption layer to be fixedly mounted on the main surface of the insulation substrate and enables the second moisture prevention layer to be fixedly mounted on the main surface of the insulation substrate.

* * * * *